United States Patent
Chen et al.

(10) Patent No.: US 11,585,351 B2
(45) Date of Patent: Feb. 21, 2023

(54) FAN FAILURE COMPENSATION

(71) Applicant: Dell Products, L.P., Round Rock, TX (US)

(72) Inventors: Hui Chen, Shanghai (CN); Xu Chen, Shanghai (CN); Yonghe Li, Shanghai (CN)

(73) Assignee: Dell Products, L.P., Round Rock, TX (US)

( * ) Notice: Subject to any disclaimer, the term of this patent is extended or adjusted under 35 U.S.C. 154(b) by 356 days.

(21) Appl. No.: 16/926,284

(22) Filed: Jul. 10, 2020

(65) Prior Publication Data

US 2021/0396237 A1 Dec. 23, 2021

(30) Foreign Application Priority Data

Jun. 19, 2020 (CN) .......................... 202010566029.1

(51) Int. Cl.
| | |
|---|---|
| H05K 7/20 | (2006.01) |
| F04D 27/00 | (2006.01) |
| G05B 15/02 | (2006.01) |
| G06F 1/20 | (2006.01) |
| F04D 25/08 | (2006.01) |
| F04D 25/16 | (2006.01) |

(52) U.S. Cl.
CPC .......... *F04D 27/001* (2013.01); *F04D 25/08* (2013.01); *F04D 25/166* (2013.01); *G05B 15/02* (2013.01); *G06F 1/20* (2013.01); *G06F 1/206* (2013.01); *H05K 7/20836* (2013.01); *F05B 2260/80* (2013.01)

(58) Field of Classification Search
USPC ............................................ 454/184; 700/21
See application file for complete search history.

(56) References Cited

U.S. PATENT DOCUMENTS

| 8,374,716 B1* | 2/2013 | Frankel ................. G05B 15/02 |
|---|---|---|
| | | 700/170 |
| 2005/0163615 A1* | 7/2005 | Chheda ................ H05K 7/2019 |
| | | 257/E23.099 |
| 2014/0364048 A1* | 12/2014 | Milligan ............ H05K 7/20736 |
| | | 454/184 |
| 2018/0054918 A1* | 2/2018 | Wang ................... H05K 1/0203 |
| 2021/0172448 A1* | 6/2021 | Chen ................... F04D 29/5813 |

* cited by examiner

*Primary Examiner* — Emilio J Saavedra
(74) *Attorney, Agent, or Firm* — Fogarty LLP

(57) ABSTRACT

A system of fans ventilates heated air from within an IHS (Information Handling System), such as a rack-mounted server, when operated during normal conditions at a rated fan speed. A controller detects a failure of a fan of this fan system and identifies the functioning fans of the system. One or more of the functioning fans are selected for boosting by operation of a fan failure compensation circuit that has been configured for delivery of additional power to the selected boost fans. The fan failure compensation circuit delivers an output voltage that boost the airflow output of the system to compensate for the failed fan. By increasing the output voltage by approximately twenty percent, the boosted fans operate at approximately fifteen percent above rated speeds, which has been demonstrated to compensate for a failed fan while avoiding further failures during the expected lifespan of the fan system.

18 Claims, 3 Drawing Sheets

FAN FAILURE COMPENSATION

FIELD

This disclosure relates generally to Information Handling Systems (IHSs), and more specifically, to airflow cooling of IHSs.

BACKGROUND

As the value and use of information continues to increase, individuals and businesses seek additional ways to process and store information. One option is an Information Handling System (IHS). An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, global communications, etc. In addition, IHSs may include a variety of hardware and software components that may be configured to process, store, and communicate information and may include one or more computer systems, data storage systems, and networking systems.

Components of an IHS consume electrical power and can generate significant amounts of heat. Heat within an IHS may degrade the reliability and performance of IHS components, possibly resulting in costly malfunctions and component failures. In order to dissipate generated heat, an IHS may include a cooling fan, or one or more sets of cooling fans that are organized and operated as an airflow cooling system. Data centers may house large numbers of IHSs, such as servers that are stacked and installed within racks. Supporting airflow cooling within a rack-mounted IHS that is installed within a data center is complicated by the constraints posed by the densely packed racks that are prevalent in data centers. As a result, the airflow cooling systems of such rack-mounted IHSs are specialized for operation within densely packed data center environments.

SUMMARY

In various embodiments, systems are provided for airflow cooling of an Information Handling System (IHS). The systems include: a plurality of fans for ventilating heated air from within the IHS, wherein each of the plurality of fans is operated at a rated fan speed using a base voltage; a controller configured to: detect a failure of a first fan of the plurality of fans; identify a plurality of functioning fans of the plurality of fans; determine a first plurality of boost fans of the functioning fans; configure a fan failure compensation circuit for delivery of additional power to the first plurality of boost fans; and enable an output voltage by the fan failure compensation circuit, wherein the enabled output voltage boosts the airflow output of the first plurality of boost fans.

In additional system embodiments, the output voltage of the fan failure compensation circuit boosts a fan speed of the first plurality of boost fans above the rated fan speed. In additional system embodiments, the output voltage of the fan failure compensation circuit is approximately twenty percent greater than the base voltage of the plurality of fans. In additional system embodiments, the boosted fan speed is approximately fifteen percent greater than the rated fan speed of the plurality of fans. In additional system embodiments, the first plurality of boost fans is determined by selection from the functioning fans based on the location of a respective functioning fan relative to the failed first fan. In additional system embodiments, the airflow cooling maintains a temperature of the IHS below a first margin from a specification temperature associated with the IHS, and wherein the system maintains the first margin below the specification temperature after the failure of the first fan by operation of the fan failure compensation circuit. In additional system embodiments, fan failure compensation circuit is configured for delivery of additional power to the first plurality of boost fans for a first interval and wherein the controller is further configure to determine a second plurality of boost fans of the functioning fans and wherein the fan failure compensation circuit is configured for delivery of additional power to the second plurality of boost fans for a second interval. In additional system embodiments, the first plurality of boost fans are selected based on whether the failure of the first fan is a complete failure or a partial failure. In additional system embodiments, the first plurality of boost fans are selected based on whether the failed first fan is a double-rotor fan.

In various additional embodiments, Information Handling Systems (IHSs) are provided that include: one or more processors and a plurality of memory devices coupled to the one or more processors; a chassis; a plurality of fans extending along a midplane of the chassis, wherein the plurality of fans ventilate heated air from within the IHS, and wherein each of the plurality of fans is operated at a rated fan speed using a base voltage; and a controller configured to: detect a failure of a first fan of the plurality of fans; identify a plurality of functioning fans of the plurality of fans; determine a first plurality of boost fans of the functioning fans; configure a fan failure compensation circuit for delivery of additional power to the first plurality of boost fans; and enable an output voltage by the fan failure compensation circuit, wherein the enabled output voltage boosts the airflow output of the first plurality of boost fans.

In additional IHS embodiments, the output voltage of the fan failure compensation circuit boosts a fan speed of the first plurality of boost fans above the rated fan speed. In additional IHS embodiments, the first plurality of boost fans is determined by selection from the functioning fans based on the location of a respective functioning fan relative to the failed first fan. In additional IHS embodiments, the fan failure compensation circuit is configured for delivery of additional power to the first plurality of boost fans for a first interval and wherein the controller is further configure to determine a second plurality of boost fans of the functioning fans and wherein the fan failure compensation circuit is configured for delivery of additional power to the second plurality of boost fans for a second interval. In additional IHS embodiments, the first plurality of boost fans are selected based on whether the failure of the first fan is a complete failure or a partial failure. In additional IHS embodiments, the first plurality of boost fans are selected based on whether the failed first fan is a double-rotor fan.

In various additional embodiments, methods are provided for airflow cooling of an Information Handling System (IHS). The methods include: ventilating heated air from within the IHS using a plurality of fans, wherein each of the plurality of fans is operated at a rated fan speed using a base voltage; detecting a failure of a first fan of the plurality of fans; identifying a plurality of functioning fans of the plurality of fans; determining a first plurality of boost fans of the functioning fans; configuring a fan failure compensation circuit for delivery of additional power to the first plurality of boost fans; and enabling an output voltage by the fan failure compensation circuit, wherein the enabled output voltage boosts the airflow output of the first plurality of boost fans, and wherein the output voltage of the fan failure compensation circuit boosts a fan speed of the first plurality of boost fans above the rated fan speed.

In additional method embodiments, the output voltage of the fan failure compensation circuit is approximately twenty percent greater than the base voltage of the plurality of fans, wherein the boosted fan speed is approximately fifteen percent greater than the rated fan speed of the plurality of fans. In additional method embodiments, the first plurality of boost fans is determined by selection from the functioning fans based on the location of a respective functioning fan relative to the failed first fan. In additional method embodiments, the first plurality of boost fans are selected based on whether the failure of the first fan is a complete failure or a partial failure. In additional method embodiments, the first plurality of boost fans are selected based on whether the failed first fan is a double-rotor fan.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity, and have not necessarily been drawn to scale.

DETAILED DESCRIPTION

Figure 1:
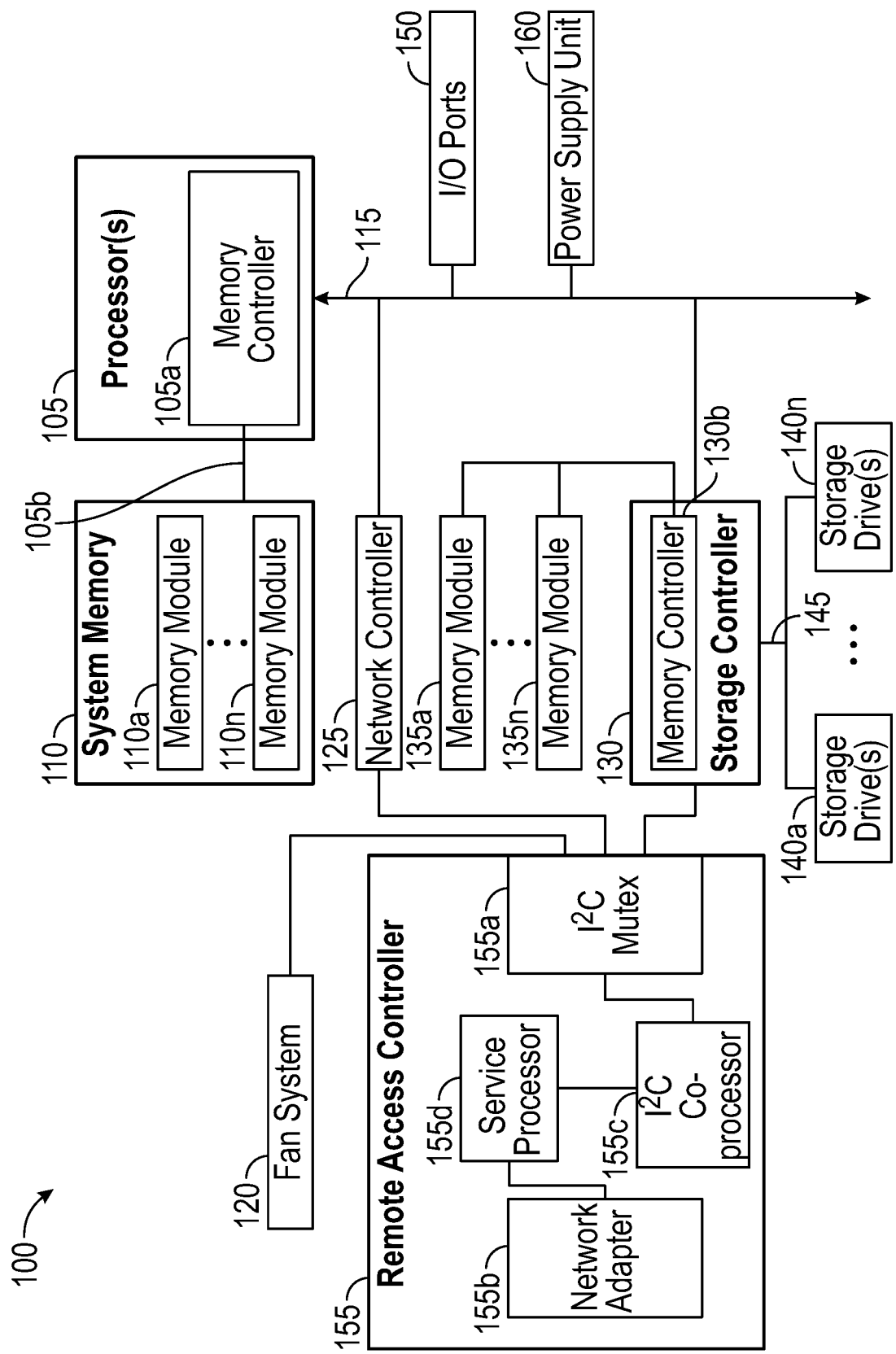
FIG. 1 is a diagram illustrating certain components of an IHS configured, according to some embodiments, for fan failure compensation.

For purposes of this disclosure, an IHS may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an IHS may be a personal computer (e.g., desktop or laptop), tablet computer, mobile device (e.g., Personal Digital Assistant (PDA) or smart phone), server (e.g., blade server or rack server), a network storage device, or any other suitable device and may vary in size, shape, performance, functionality, and price. An IHS may include Random Access Memory (RAM), one or more processing resources, such as a Central Processing Unit (CPU) or hardware or software control logic, Read-Only Memory (ROM), and/or other types of nonvolatile memory.

Additional components of an IHS may include one or more disk drives, one or more network ports for communicating with external devices as well as various I/O devices, such as a keyboard, a mouse, touchscreen, and/or a video display. An IHS may also include one or more buses operable to transmit communications between the various hardware components. An example of an IHS is described in more detail below. It should be appreciated that although certain IHSs described herein may be discussed in the context of an enterprise computing servers, other embodiments may be utilized.

As described, in a data center environment, a server IHS may be installed within a chassis, in some cases along with other similar server IHSs. A rack may house multiple such chassis and a data center may house numerous racks. Each rack may host a large number of IHSs that are installed as components of a chassis and multiple chassis may be stacked and installed within racks. In such rack-mounted server IHSs, airflow cooling must be provided within the constraints of a densely packed data center environment. This results on significant demands on the airflow cooling system of such data center IHSs that may operate around the clock, thus contributing to wear on the cooling system and eventually resulting in fan failures.

In general, providing additional cooling using an airflow cooling system allows an IHS to provide improved capabilities by increasing the performance of heat-generating, internal components of the IHS, such as by operating processors of the IHS at faster operating speeds.

In some instances, the performance characteristics that are supported by an IHS are determined based, in part, on the worst case cooling capabilities of the IHS. For instance, in an IHS that includes a multi-fan system, such as a rack-mounted server, the supported performance characteristics of such an IHS may be determined based on a worst case cooling scenario in which one of the fans in the multi-fan system has failed. In such instances, the cooling capabilities that can be provided by a cooling system despite the occurrence of a fan failure may significantly impact the performance characteristics that are supported by an IHS. In circumstances where additionally cooling that is greater than the worst-case cooling is available, additional performance capabilities of the IHS may be enabled, but the base performance capabilities that are supported by the IHS during normal operating conditions are often determined, at least in part, based on the minimum level of airflow cooling that can be expected to be generated by the cooling system, regardless of the operating conditions. If this minimum level of cooling that can be supported by an airflow cooling system during such worst case conditions can be increased, greater performance may be supported by an IHS.

FIG. 1 illustrates components of an IHS 100 configured according to various embodiments to implement systems and methods described herein for fan failure compensation. Although the embodiments provided herein describe an IHS that is a rack-mounted server, other embodiments may be implemented using other types of IHSs. In the illustrative embodiment of FIG. 1, IHS 100 may be a server that would typically be installed within a chassis, that in turn would be typically installed within slots of a rack, such as described above. Installed in this manner, IHS 100 may utilize certain shared resources provided by the chassis and/or rack, such as power and networking. In some embodiments, multiple servers such as IHS 100 may be installed within a single chassis. For instance, IHS 100 may be a 1RU (Rack Unit) server that is paired with another 1RU component, such as another server similar to IHS 100, and installed with a 2RU chassis.

IHS 100 may include one or more processors 105. In some embodiments, processors 105 may include a main processor and a co-processor, each of which may include a plurality of processing cores. IHS 100 may operate using a chipset that may be implemented by integrated circuits that couple processor 105 to various other components of the motherboard of IHS 100. In some embodiments, all or portions of the chipset may be implemented directly within the integrated circuitry of an individual processor 105. The chipset may provide the processor(s) 105 with access to a variety of resources accessible via one or more buses 115. Various embodiments may utilize any number of buses to provide the illustrated pathways provided by the single illustrated bus 115. In certain embodiments, bus 115 may include a PCIe (PCI Express) switch fabric that is accessed via a root complex and serves to couple processor 105 to a variety of internal and external PCIe devices.

In some instances, a specification of processor 105 may specify a maximum operating temperature (i.e., the processor's specification temperature or "spec" temperature) for the processor, where this spec temperature may be provided by the manufacturer of processor 105. In order to maintain the operating temperature of processor 105 below this spec temperature, one or more temperatures associated with the processor 105 may be determined directly or indirectly using temperature measurements by one or more sensors. In some embodiments, processor 105 is selected and/or configured based on the airflow cooling capabilities of the fan system 120 of IHS 100. For instance, a faster processor or a setting enabling faster processing speeds may be selected for use in IHS 100 based on whether the fan system 120 can generate sufficient airflow to provide cooling for that faster processor speed. In some embodiments, the processor selection or processor speed selection is based on the worst case cooling capabilities of fan system 120, described in additional detail below. If the worst case cooling capabilities of fan system 120 are insufficient to cool processor 105 below its temperature margin, a slower processor or slower processing speed may be selected, thus degrading the potential performance capabilities that may be provided using IHS 100.

As illustrated, processor(s) 105 may include an integrated memory controller 105a that may be implemented directly within the circuitry of the processor 105, or the memory controller 105a may be a separate integrated circuit that is located on the same die as the processor 105.

The memory controller 105a may be configured to manage the transfer of data to and from the system memory 110 of the IHS 105 via a high-speed memory interface 105b. System memory 110 may include memory components, such as such as static RAM (SRAM), dynamic RAM (DRAM), NAND Flash memory, suitable for supporting high-speed memory operations by the processor(s) 105. System memory 110 may combine both persistent, non-volatile memory and volatile memory. In certain embodiments, the system memory 110 may be comprised of multiple removable memory modules. The system memory 110 of the illustrated embodiment includes removable memory modules 110a-n. Each of the removable memory modules 110a-n may utilize a form factor corresponding to a motherboard expansion card socket that receives a type of removable memory module 110a-n, such as a DIMM (Dual In-line Memory Module). Other embodiments of IHS system memory 110 may be configured with memory socket interfaces that correspond to different types of removable memory module form factors, such as a Dual In-line Package (DIP) memory, a Single In-line Pin Package (SIPP) memory, a Single In-line Memory Module (SIMM), and/or a Ball Grid Array (BGA) memory.

In various embodiments, a variety of resources may be coupled to the processor(s) 105 of the IHS 100 via buses 115 managed by the processor chipset. In some cases, these resources may be components of the motherboard of IHS 100 or these resources may be resources coupled to IHS 100, such as via I/O ports 150. In some embodiments, IHS 100 may include one or more I/O ports 150, such as PCIe ports, that may be used to couple the IHS 100 directly to other IHSs, storage resources or other peripheral components. In certain embodiments, the I/O ports 150 may provide couplings to a backplane or midplane of the chassis in which the IHS 100 is installed.

As illustrated, IHS 100 may also include a power supply unit 160 that provides the components of the chassis with appropriate levels of DC power. The power supply unit 160 may receive power inputs from an AC power source or from a shared power system that is provided by a rack within which IHS 100 may be installed. In certain embodiments, power supply unit 160 may be implemented as a swappable component that may be used to provide IHS 100 with redundant, hot-swappable power supply units.

As illustrated, processor(s) 105 may also be coupled to a network controller 125, such as provided by a Network Interface Controller (NIC) that is coupled to the IHS 100 and allows the IHS 100 to communicate via an external network, such as the Internet or a LAN. Network controller 125 may include various microcontrollers, switches, adapters, and couplings used to connect IHS 100 to a network, where such connections may be established by IHS 100 directly or via shared networking components and connections provided by a rack in which chassis 100 is installed. In some embodiments, network controller 125 may allow IHS 100 to interface directly with network controllers from other nearby IHSs in support of clustered processing capabilities that utilize resources from multiple IHSs. In some embodiments, network controller 125 may be swappable component that may be externally accessed and replaced while IHS 100 remains operational.

IHS 100 may include one or more storage controllers 130 that may be utilized to access storage drives 140a-n that are accessible via the chassis in which IHS 100 is installed. Storage controllers 130 may provide support for RAID (Redundant Array of Independent Disks) configurations of logical and physical storage drives 140a-n. In some embodiments, storage controller 130 may be an HBA (Host Bus Adapter) that provides limited capabilities in accessing physical storage drives 140a-n. In many embodiments, storage drives 140a-n may be replaceable, hot-swappable storage devices that are installed within bays provided by the chassis in which IHS 100 is installed. In some embodiments, storage drives 140a-n may also be accessed by other IHSs that are also installed within the same chassis as IHS 100. Although a single storage controller 130 is illustrated in FIG. 1, IHS 100 may include multiple storage controllers that may operate similarly to storage controller 130. In embodiments where storage drives 140a-n are hot-swappable devices that are received by bays of chassis, the storage drives 140a-n may be coupled to IHS 100 via couplings between the bays of the chassis and a midplane 145 of IHS 100. Storage drives 140a-n may include SAS (Serial Attached SCSI) magnetic disk drives, SATA (Serial Advanced Technology Attachment) magnetic disk drives, solid-state drives (SSDs) and other types of storage drives in various combinations.

As with processor(s) 105, storage controller 130 may also include an integrated memory controller 130b that may be used to manage the transfer of data to and from one or more memory modules 135a-n via a high-speed memory interface. Through use of memory operations implemented by memory controller 130b and memory modules 135a-n, storage controller 130 may operate using cache memories in support of storage operations that are both safe and fast.

Memory modules 135a-n may include memory components, such as such as static RAM (SRAM), dynamic RAM (DRAM), NAND Flash memory, suitable for supporting high-speed memory operations and may combine both persistent, non-volatile memory and volatile memory. As with the system memory 110, the memory modules 135a-n may utilize a form factor corresponding to a memory card socket, such as a DIMM (Dual In-line Memory Module).

As illustrated, IHS 100 includes a remote access controller (RAC) 155 that provides capabilities for remote monitoring and management of various aspects of the operation of IHS 100. In support of these monitoring and management functions, remote access controller 155 may utilize both in-band and sideband (i.e., out-of-band) communications with various internal components of IHS 100. Remote access controller 115 may collect sensor data, such as temperature sensor readings, from components of the IHS 100 and from the chassis in which IHS is installed. The temperature sensor readings collected by remote access controller 115 may be utilized in support of airflow cooling of the IHS 100 using fan system 120. In addition to collecting data used in operating the fan system 120, as described in additional detail with regard to the below embodiments, a remote access controller 115 may implement procedures in support of compensation for failures that are detected within fan system 120.

In support of such capabilities, remote access controller 115 may be configured to detect various types of failures within fan system 120. For instance, in embodiments where IHS 100 is a rack-mounted server, fan system 120 may include a bank of cooling fans that are aligned side-by-side and extend along a midplane of the chassis of IHS 100, where the bank of fans is operated to ventilate heated air from within the internal compartments of the chassis of IHS 100. Remote access controller 115 may include capabilities for detecting failures in any one of the individual fans of the fan system 120. In some embodiments, remote access controller 115 may detect a complete failure of one of the fans of fan system 120, such as through detection of an error condition transmitted by the nonoperational fan or otherwise generated in response to attempting communications with the nonoperational fan. In some embodiments, remote access controller 115 may detect a partial fan failure within fan system 120, such as through detecting a low RPM condition in one of the fans.

In some embodiments, the individual, side-by-side slots of fan system 120 that extends along the midplane of a chassis may each include a fan pack that has two separate fan motors that are aligned along a common axis of rotation, where each fan spins a separate rotor and separate fan impeller. Each of the motors of a fan pack is separately powered and controlled, thus providing redundant fan capabilities within a single fan slot. Using such fan pack systems, a failure in one fan does not prevent the fan pack from generating airflow using its other, still operational, fan. In this manner, a fan pack prevents the creation of a void in the airflow that is generated by a bank of cooling fans. Such a void would otherwise result from a fan failure within a system of single-motor fans. In scenarios where voids in airflow output are created in a bank of cooling fans, such voids provide a pathway for reverse airflow within the IHS, thus generating a circular flow of air between the inner compartments of an IHS rather than ventilating heated air from within the compartments. In airflow systems that utilize such fan packs, the remote access controller 115 may detect failures of the individual fans of a fan pack within fan system 120.

As described in additional detail below, in various embodiments of IHS 100, remote access controller 115 may be configured to detect failures within fan system 120 and may also be configured initiate procedures for compensating for the detected fan failure. For instance, remote access controller 115 may enable a fan failure compensation circuit that allows the remote access controller 115 to route additional power to one or more of the remaining operational fans of the fan system 120. In some embodiments, remote access controller 115 may utilize the fan failure compensation circuit to alternate in providing additional power to different combinations of the operational fans of the fan system 120. As described in additional detail below, remote access controller 115 may be configured to select between the available operational fans of fan system 120 in a manner that allows the remaining operating fans of the fan system 120 to compensate for the fan failure, while still maintaining the operation of these fans within thresholds that have been demonstrated by the inventors to allow fan system 120 to continue operating without additional fan failures for the expected remaining lifespan of the fan system 120, and/or until an administrator has an opportunity to service IHS 100 and replace the failed fan. In some embodiments, remote access controller 155 may implement some or all of these fan failure compensation techniques in collaboration with a fan controller of fan system 120.

In addition to supporting airflow cooling, remote access controller 155 may additionally implement a variety of additional management capabilities. In some instances, remote access controller 155 may operate from a different power plane from the processors 105, storage drives 140a-n and other components of IHS 100, thus allowing the remote access controller 155 to operate, and management tasks to proceed, while the processing cores of IHS 100 are powered off. Various BIOS functions, including launching the operating system of the IHS 100, may be implemented by the remote access controller 155. In some embodiments, the remote access controller 155 may perform various functions to verify the integrity of the IHS 100 and its hardware components prior to initialization of the IHS 100 (i.e., in a bare-metal state).

Remote access controller 155 may include a service processor 155d or specialized microcontroller, that operates management software that supports remote monitoring and administration of IHS 100. Remote access controller 155 may be installed on the motherboard of IHS 100 or may be coupled to IHS 100 via an expansion slot provided by the motherboard. In support of remote monitoring functions, network adapter 155b may support connections between remote administrative operations and remote access controller 155, where these administrative connections may be supported via wired and/or wireless network connections. In some instances, the network connectivity provided by network adapter 155b may support communications with nearby remote access controllers operating in support of nearby IHSs, such as in adjacent rack-mounted servers.

The service processor 155d of the remote access controller 155 may rely on an 120 co-processor 155c to implement 120 communications with the managed components of the IHS 100. The 120 co-processor 155c may be a specialized co-processor or micro-controller that is configured to interface via a sideband 120 bus interface with the managed hardware systems of the IHS 100, such as network controller 125, storage controller 130 and fan system 120. As illustrated, the 120 co-processor 155c may interface with the individual managed systems 120, 125 and 130 via a sideband buses selected through the operation of an 120 multiplexer 155a.

In various embodiments, an IHS 100 does not include each of the components shown in FIG. 1. In various embodiments, an IHS 100 may include various additional components in addition to those that are shown in FIG. 1. Furthermore, some components that are represented as separate components in FIG. 1 may in certain embodiments instead be integrated with other components. For example, in certain embodiments, all or a portion of the functionality provided by the illustrated components may instead be provided by components integrated into the one or more processor(s) 105 as a systems-on-a-chip.

Figure 2A:
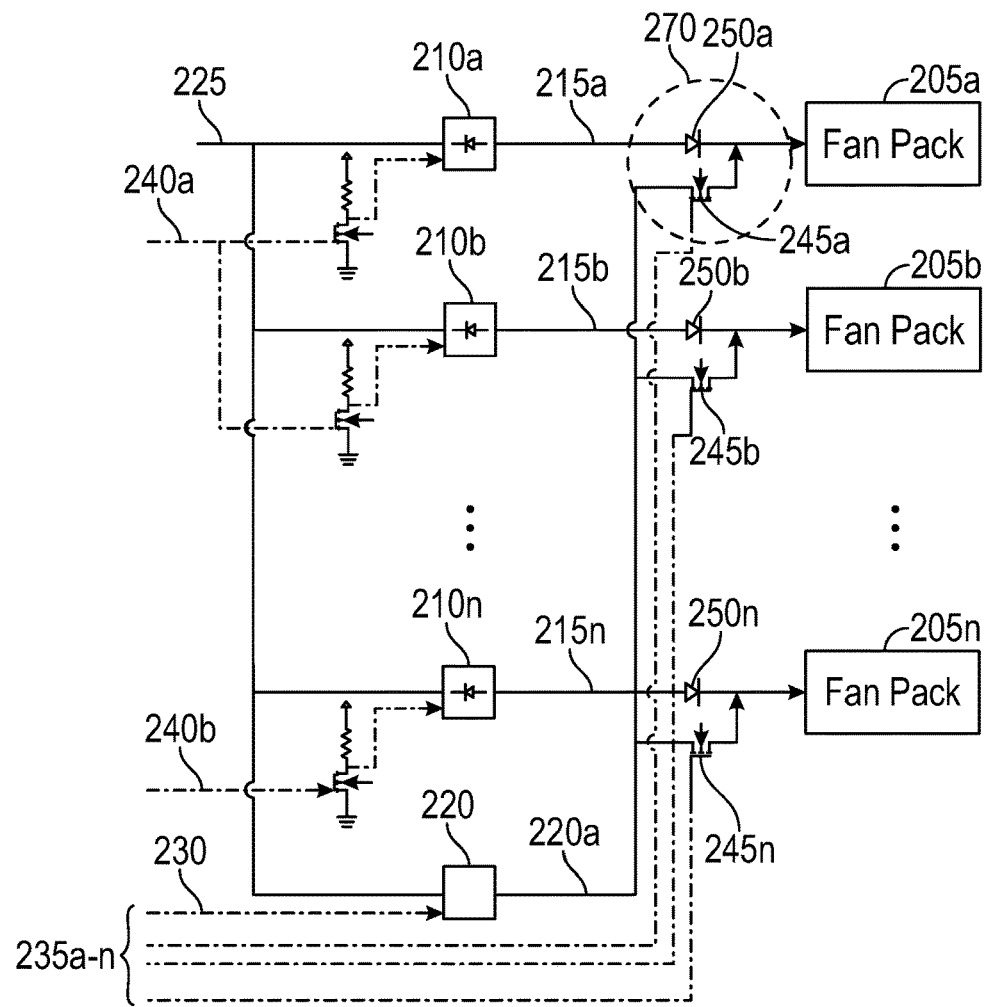
FIG. 2A is a circuit diagram providing fan failure compensation according to various embodiments.

FIG. 2A is a circuit diagram providing fan failure compensation according to various embodiments. As described, an IHS such as a rack-mounted server may include a fan system that has at least one set of cooling fans that are individually operated as elements of an airflow cooling system. In some such cooling systems, the fans that are utilized are dual-rotor fan packs 205a-n that each include two separate fan motors that each operate separate rotors and impellers. When one fan of a dual-rotor fan pack 205a-n fails, the other fan of the fan pack may continue to operate, thus preventing the occurrent of the described voids in the airflow generated by the fan system. FIG. 2A illustrates a circuit diagram, according to various embodiments, utilized by a fan system, such as described with regard to FIG. 1, in the operation of a set of fan packs 205a-n that each provide redundant airflow capabilities within a single slot of a bank of fans.

The circuit diagram of FIG. 2A illustrates pathways for delivering power to a system of fan packs 205a-n and for implementing procedures for compensating for the failures detected within the fan packs 205a-n. The operation of each fan pack 205a-n may be enabled through configuration of a respective switch 210a-n that allows the flow of current from a power rail 225 that is utilized as an input to the fan system during normal operating conditions. For instance, configuration of switch 210a allows flow of a current from a power rail 225, such as a 12-volt base voltage that is used to power each of the fan packs 205a-n during normal operating conditions. Upon configuration of switch 210a, the base voltage flows along pathway 215a and powers fan pack 205a.

In some embodiments, the individual switches 210a-n may be configured based on signals generated by a remote access controller, such as described with regard to FIG. 1. In the embodiment of FIG. 2A, such signals are transmitted via signaling pathways 240a and 240b. As illustrated, a signaling pathway 240a may serve to configure multiple switches 210a, 210b, or a signaling pathway 240b may serve to configure a single switch 210n. In some embodiments, the signals delivered via signaling pathways 240a and 240b may be generated by a fan controller that is configured to manage the delivery of a base voltage to the fan packs 205a-n, where this base power delivery is managed by the fan controller according to the specification of the fan packs 205a-n. In other embodiments, fan system management operations described herein are implemented by a remote access controller, without use of a separate fan controller.

During normal operating conditions, each of the fan packs 205a-n is fully operational and is used in contributing to the ventilation provided by the fan system. However, as described, individual fans of a fan system may fail, either partially or fully. In some embodiments, a remote access controller and/or a fan controller may detect failure conditions within a fan system. In particular, failures of individual fans may be detected, including failures of individual fans of dual-rotor fan packs 205a-n. As described in additional detail below, upon detecting such failures within a fan system, the remote access controller may identify the fans of the fan system that remain operational. From these remaining operational fans, the remote access controller may select one or more fans for delivery of an auxiliary boost voltage. Once these fans have been selected, the remote access controller may deliver signals along pathways 240a-b for disabling delivery of the base voltage 225 to these selected fans and may deliver additional signals along pathways 235a-n for enabling delivery of the boost voltage to the selected fans. For instance, once delivery of the base voltage 225 has been disabled via configuration of switch 210a, a signal delivered via pathway 235a may configure a transistor 245a in a manner that allows flow of a boost voltage 220a to fan pack 205a. In various scenarios, remote access controller may be configured to enable multiple of the operational fan packs 205a-n for delivery of a boost voltage for an indefinite duration or may cycle between enabling various combinations of the operational fan packs 205a-n for limited durations.

Once the operational fan packs selected for delivery of a boost voltage have been enabled through configuration of transistors 245a-n or other such switching elements, the remote access controller may issue a signal on pathway 230 that enables a boost circuit 220 that provides the boost voltage 220a to the fan packs selected for boosting. As illustrated, the boost circuit 220 receives the power rail 225 input voltage and delivers the boost voltage 220a to the selected fan packs. In some embodiments, the signals transmitted via pathway 230 may configure the boost circuit 220 for delivery of one of a set of predefined boost voltages that are supported by the boost circuit 220. For instance, the signals transmitted by a remote access controller via pathway 230 may result in the configuration of a voltage multiplier within boost circuit 220 that supports a specific set of voltage outputs that are generated by multiplying the base voltage of power rail 225. As described in additional detail below, some embodiments may configure delivery of a boost voltage that is approximately 120% of the base voltage that is provided to fans under normal operating conditions.

As illustrated, each pathway 215a-n for delivering a base voltage to the individual fan packs 205a-n includes a diode 250a-n that prevent reverse current flow during periods of boost voltage delivery. For instance, diode 250a prevents any reverse flow of boost voltage 220a delivered to fan pack 205a is a result of configuration of transistor 245a for delivery of the boost voltage to this fan pack. Some embodiments may utilize diodes 250a-n that result in a negligible drop in the base voltage 215a-n that is received by the fan packs 205a-n during normal operating conditions. In order to support improved efficiency, in some embodiments, the diode 250a and transistor 245a demarcated by region 270 in FIG. 2A may instead be implemented using circuitry such as illustrated in the circuit diagram of FIG. 2B.

Figure 2B:
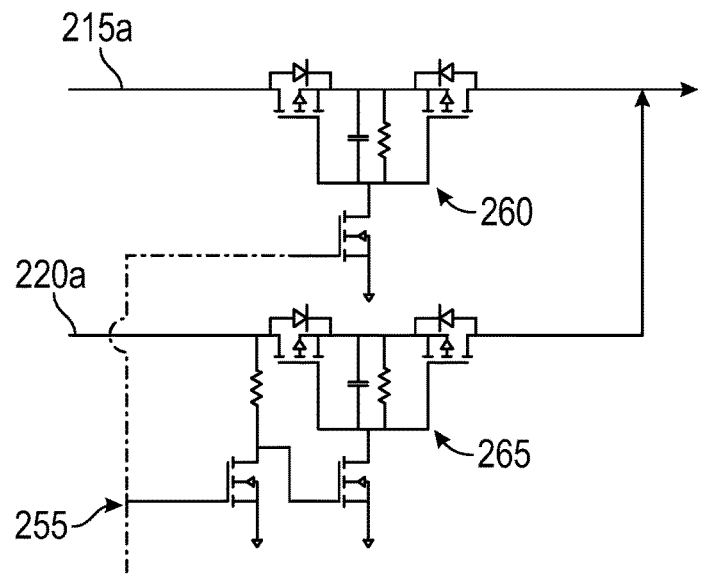
FIG. 2B is an additional circuit diagram providing additional aspects of fan failure compensation according to various embodiments.

In the circuit diagram of FIG. 2B, two transistor circuits 260, 265 are utilized for separately enabling and disabling the flow of a base voltage 215a or a boost voltage 220a to a particular fan. In the illustrated embodiments, each of the transistor circuits 260, 265 is an ORing circuit that includes back-to-back MOSFETs that can each be configured to enable and disable the flow of current to the fan via the respective power pathways 215a, 220a and to provide bi-directional blocking of reverse current flows. The operation of the ORing circuits 260, 265 are configured via signals transmitted by the remote access controller via pathway 255. In some embodiments, the remote access controller may issue one signal via 255 that results in opposite configurations of the ORing circuits 260, 265. For instance, during normal operations during which all components of a fan system are operational, a signal issued via pathway 255 serves to configure ORing circuit 260 to enable the base voltage 215*a* to flow, while also configuring ORing circuit 265 to prevent reverse current flow via pathway 220*a*. Once a fan failure has been detected the remote access controller may reverse the logic of the signal issued on pathway 255, thus disabling the delivery of the base voltage 215*a* via ORing circuit 260 and enabling delivery of the boost voltage 220*a* via ORing circuit 265, with the configuration of ORing circuit 260 also serving to prevent the reverse flow of the boost voltage via pathway 215*a*. Embodiments may utilize circuits such as illustrated in FIG. 2B in order to provide improved efficiency. In particular, the ORing circuits 260, 265 may reduce the drop in the voltage of delivered power compared to the circuits utilized in FIG. 2A, while also providing effective blocking of reverse current flows.

Figure 3:
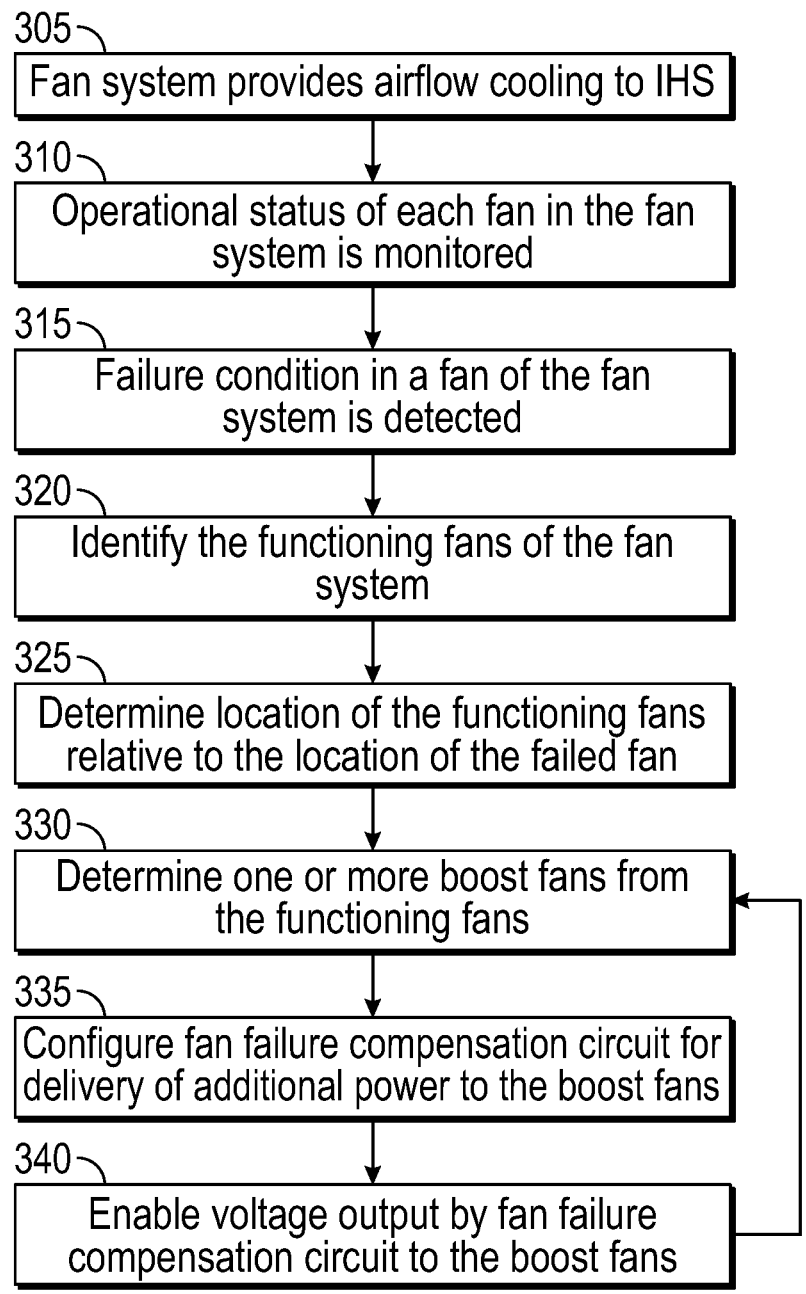
FIG. 3 is a flowchart describing certain steps of a method, according to some embodiments, for fan failure compensation.

FIG. 3 is a flowchart describing certain steps of a method, according to some embodiments, for fan failure compensation. Embodiments may begin at block 305 within a multi-fan cooling system providing airflow cooling to an IHS during normal operating conditions in which all of the fans of a fan system are operation. During intervals of normal operating conditions, the fans may be operated as described with regard to FIG. 2A, such that a base voltage is delivered to each of the fans in order to operate the fans at their rated speeds. For instance, the individual fans of a fan system may be designed to function according to a specification that provides an RPM rating at which a fan can be expected to reliably operate for a specified duration. In various embodiments, a remote access controller and/or a fan controller may operate the cooling fans during normal operating conditions by enabling delivery of a base voltage that operates each of the fans at their rated RPM settings. During normal operating conditions, the fan system provides sufficient airflow cooling to support the operation of the processor of an IHS at or below its specification temperature, or within a certain margin of this specification temperature of the IHS processor.

While the fan system is in operation, at block 310 the operational status of each of the fans in the fan systems is monitored. In some instances, complete fan failures may be identified by detecting error codes or other signals indicating a nonoperational fan. Complete fan failures may also be identified through RPM measurements of a fan that indicate a fan rotor has stopped spinning or is spinning too slow to contribute any airflow to the operation of the cooling system. In certain embodiments, partial fan failures may also be identified through RPM measurements indicate a fan rotor is still spinning, but at a speed below its RPM rating. At block 315, such failure conditions in a fan of the fan system are detected. As described, in certain fan systems, dual-rotor fan packs are utilized in which the separate rotors of the fan may operate and fail independently from each other. In systems utilizing such fan packs, the detected error conditions may include the detection of a failure by one of the fans of a fan pack.

Upon detecting a fan failure within a fan system, at block 320, the operational fans of the fan system may be identified. In some instances, the operational status of each operational fan may be verified through queries or other signals issued by a remote access controller. In some embodiments, at block 325, the location of each operational fan relative to the location of the failed fan may be determined. As described, in fan systems comprised of a bank of cooling fans that extend along a midplane of a rack-mounted server, a failure in one of the fans may result in a void in the airflow output of the bank of fans. Such voids provide a pathway for reverse airflow within an IHS and reduce the efficiency of the fans that remain operational. For instance, a reverse flow pathway resulting from a fan failure may create circular airflow loops within the compartments of an IHS, thus mitigating the fan system's ability to ventilate heated air from within the IHS. In fan systems utilizing dual-rotor fan packs, a failure by both fans of a fan pack is required in order to create such voids, but such fan pack failures may nonetheless occur.

At block 330, the remote access controller determines which of the operational fans of the fan system to provide with a boost voltage. In response to the detected fan failure, the remote access controller may configure and operate a fan failure compensation circuit, such as described with regard to FIG. 2A, in order to provide a boost voltage to one or more of the fans that remain operational within the fan system, thus allowing these selected fans to be operated at speeds above their RPM ratings. In certain instances, the remote access controller may select all of the operational fans for delivery of a boost voltage. In some embodiments, the remote access controller may select a subset of the operational fans for delivery of a boost voltage, but may enable boost voltage delivery to this selected set of operational fans only for a selected interval. After this interval has expired, the remote access controller may select another subset of the operational fans for delivery of a boost voltage for the selected interval. In this manner, the remote access controller may cycle through the operational fans in order to limit the stress placed on any individual fan as a result of operating the fans above their RPM rating during boosting intervals. In some embodiments, the number of operational fans selected for boosting during each cycle may be determined based on whether the detected fan failure is a complete failure or a partial failure in which a fan is operating at a reduced RPM. In some embodiments, the number of operational fans selected for boosting during each cycle may be determined based on whether the fans in use, and in particular the failed fan, is a double-rotor fan. As described, complete failure of a single-rotor fan may result in an airflow void allowing for reverse airflow withing the IHS. Double-rotor fans prevent such airflow voids as long as both fans of a fan pack fail. In scenarios where an airflow void has been created due to a fan failure, a smaller number of operational fans may selected for boosting operations, with the fans selected based on their respective distance from the failed fan and thus of the created airflow void.

In some embodiments, the remote access controller may select operational fans for providing a boost voltage based on the location of operational fans from the failed fan. For instance, in scenarios where a fan failure within a bank of fans has resulted in an airflow void allowing for a circular flow of air through this void, operational fans adjacent to the void may not be selected for providing a boost voltage. Instead, operational fans furthest from void resulting from the fan failure may be selected for a boost voltage since the resulting additional airflow from these fans is more likely to result in ventilating heated air from within an IHS, rather than contributing to the circular flow of air through the void in the fan system.

Once the operational fans have been selected for boosting, at block 335, the remote access controller configures a fan failure compensation circuit, such as described with regard to FIGS. 2A-B, for delivery of a boost voltage to the selected fans. For instance, the remote access controller may disable delivery of the base voltage and enable delivery of a boost voltage to the individual fans that have been selected, thus operating these selected fans at a speed above their RPM ratings. At block 340, the remote access controller enables a boost voltage output by the fan failure compensation circuit. Based on the configuration of the circuit at block 335, the enabled boost voltage is delivered only to the fans that have been selected for boost operations. As described, the delivery of a boost voltage to a selected set of fans may continue indefinitely, or may be enabled for a defined interval, after which the remote access controller may return to block 330 in order to select another set of fans for boost operations during a subsequent interval, thus periodically cycling through the operational fans. In certain embodiments, fans may be selected for boost operations in each cycle depending on measured temperature readings that provide an indication of the current need for cooling by an IHS. For instance, in scenarios where the processor of an IHS is operating significantly below its specification temperature, a smaller set of fans will be selected for boost operations in comparison to scenarios where the processor is operating closer to its specification temperature. In certain embodiments, fans may be selected for boost operations in each cycle depending on the type and degree of fan failure that has been detected. In scenarios where a partial fan failure has been detected due to the fan operating significantly below its rated RPM, a smaller subset of fans may be selected for boost operations in each cycle compared to scenarios where a complete fan failure has been detected. In some embodiments, the greater the reduction in RPMs in the partially failed fan, the greater number of operational fans may be selected for boost operations in each cycle.

In this manner, the remaining operational fans of a fan system may be utilized to compensate for the failure of a fan within the fan system. This capability allows a fan system to support continued operation of an IHS despite a fan failure. Such a capability may be of limited utility if delivery of a boost voltage soon thereafter results in failures in the boosted fans. The inventors have determined that a boost voltage of approximately 20 percent above the base voltage provided to a cooling fan allows the boosted fans to sufficiently compensate for the loss of the failed fan, while not stressing the boosted fans in a manner that results in additional fan failures prior to the expected lifespan of the fan system. For instance, in a fan system utilizing a 12-volt base voltage, embodiments may utilize boost voltages in the range of 14-15 volts. Such boost voltages have been demonstrated by the inventors to operate fans at speeds that are 10-15 percent above their RPM ratings and to generate airflows that are 10-12 percent above the maximum airflow generated under normal operating conditions. When compensating for fan failures within these ranges, the inventors have determined that a fan system continues to provide sufficient airflow for data center cooling guidelines to be maintained. For example, fan failure compensation embodiments operating within these ranges have been shown to provide sufficient airflow cooling for a server to operate without performance downgrades while within ranges of acceptable thermal excursions, such as thermal excursion limits set forth for data center operations by the ASHRAE (American Society of Heating, Refrigerating and Air-Conditioning Engineers). Embodiments operating using these ranges have been demonstrated to provide sufficient cooling for durations that allow administrators to replace failed fans as part of regular maintenance procedures. Greater boost voltages could be used to provide additional cooling, but have been determined to result in premature failure of the boosted fans. Smaller boost voltages cause less stress on the fans, but fail to provide sufficient airflow to adequately compensate for the loss of the failed fan. Accordingly, in certain embodiments, the remote access controller may be configured to utilize the fan failure compensation circuit for boosting the voltage provided to selected operational fans, where the voltage is boosted to approximately 20 percent more than the base voltage used to power the fans.

In this manner, a fan system may compensate for the failure of a fan within this system, while maintaining sufficient airflow cooling to allow an IHS to continue as if under normal operating conditions. Accordingly, despite the failure of the fan, the processor if the IHS may operate normally, while still being provided sufficient cooling to operate within a certain margin of the specification temperature of the processor. As described, in some instances, the processor selected for use within an IHS, or the fastest processing speed that is supported by a processor may be based on the worst-case cooling capabilities of the IHS. Where the worst-case cooling is determined based on the failure of a single fan, faster processing speeds may be supported by an IHS using a fan system operated as described herein.

It should be understood that various operations described herein may be implemented in software executed by processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

The terms "tangible" and "non-transitory," as used herein, are intended to describe a computer-readable storage medium (or "memory") excluding propagating electromagnetic signals; but are not intended to otherwise limit the type of physical computer-readable storage device that is encompassed by the phrase computer-readable medium or memory. For instance, the terms "non-transitory computer readable medium" or "tangible memory" are intended to encompass types of storage devices that do not necessarily store information permanently, including, for example, RAM. Program instructions and data stored on a tangible computer-accessible storage medium in non-transitory form may afterwards be transmitted by transmission media or signals such as electrical, electromagnetic, or digital signals, which may be conveyed via a communication medium such as a network and/or a wireless link.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. A system for airflow cooling of an Information Handling System (IHS), the system comprising:
   a plurality of fans for ventilating heated air from within the IHS, wherein each of the plurality of fans is operated at a rated fan speed using a base voltage;
   a controller configured to:
      detect a failure of a first fan of the plurality of fans;
      identify a plurality of functioning fans of the plurality of fans;
      determine a first plurality of boost fans of the functioning fans;
      configure a fan failure compensation circuit for delivery of additional power to the first plurality of boost fans, wherein the fan failure compensation circuit is configured for delivery of additional power to the first plurality of boost fans for a first interval;
      enable an output voltage by the fan failure compensation circuit, wherein the enabled output voltage boosts the airflow output of the first plurality of boost fans; and
      determine a second plurality of boost fans of the functioning fans, wherein the fan failure compensation circuit is configured for delivery of additional power to the second plurality of boost fans for a second interval.

2. The system of claim 1, wherein the output voltage of the fan failure compensation circuit boosts a fan speed of the first plurality of boost fans above the rated fan speed.

3. The system of claim 2, wherein the output voltage of the fan failure compensation circuit is approximately twenty percent greater than the base voltage of the plurality of fans.

4. The system of claim 3, wherein the boosted fan speed is approximately fifteen percent greater than the rated fan speed of the plurality of fans.

5. The system of claim 1, wherein the first plurality of boost fans is determined by selection from the functioning fans based on the location of a respective functioning fan relative to the failed first fan.

6. The system of claim 1, wherein the airflow cooling maintains a temperature of the IHS below a first margin from a specification temperature associated with the IHS, and wherein the system maintains the first margin below the specification temperature after the failure of the first fan by operation of the fan failure compensation circuit.

7. The system of claim 1, wherein the first plurality of boost fans are selected based on whether the failure of the first fan is a complete failure or a partial failure.

8. The system of claim 1, wherein the first plurality of boost fans are selected based on whether the failed first fan is a double-rotor fan.

9. An Information Handling System (IHS) comprising:
   one or more processors and a plurality of memory devices coupled to the one or more processors;
   a chassis;
   a plurality of fans extending along a midplane of the chassis, wherein the plurality of fans ventilate heated air from within the IHS, and wherein each of the plurality of fans is operated at a rated fan speed using a base voltage; and
   a controller configured to:
      detect a failure of a first fan of the plurality of fans;
      identify a plurality of functioning fans of the plurality of fans;
      determine a first plurality of boost fans of the functioning fans;
      configure a fan failure compensation circuit for delivery of additional power to the first plurality of boost fans, wherein the fan failure compensation circuit is configured for delivery of additional power to the first plurality of boost fans for a first interval;
      enable an output voltage by the fan failure compensation circuit, wherein the enabled output voltage boosts the airflow output of the first plurality of boost fans; and
      determine a second plurality of boost fans of the functioning fans, wherein the fan failure compensation circuit is configured for delivery of additional power to the second plurality of boost fans for a second interval.

10. The IHS of claim 9, wherein the output voltage of the fan failure compensation circuit boosts a fan speed of the first plurality of boost fans above the rated fan speed.

11. The IHS of claim 9, wherein the first plurality of boost fans is determined by selection from the functioning fans based on the location of a respective functioning fan relative to the failed first fan.

12. The IHS of claim 9, wherein the first plurality of boost fans are selected based on whether the failure of the first fan is a complete failure or a partial failure.

13. The IHS of claim 9, wherein the first plurality of boost fans are selected based on whether the failed first fan is a double-rotor fan.

14. A method for airflow cooling of an Information Handling System (IHS), the method comprising:
   ventilating heated air from within the IHS using a plurality of fans, wherein each of the plurality of fans is operated at a rated fan speed using a base voltage;
   detecting a failure of a first fan of the plurality of fans;
   identifying a plurality of functioning fans of the plurality of fans;
   determining a first plurality of boost fans of the functioning fans;
   configuring a fan failure compensation circuit for delivery of additional power to the first plurality of boost fans, wherein the fan failure compensation circuit is configured for delivery of additional power to the first plurality of boost fans for a first interval;
   enabling an output voltage by the fan failure compensation circuit, wherein the enabled output voltage boosts the airflow output of the first plurality of boost fans, and wherein the output voltage of the fan failure compensation circuit boosts a fan speed of the first plurality of boost fans above the rated fan speed; and determining a second plurality of boost fans of the functioning fans, wherein the fan failure compensation circuit is configured for delivery of additional power to the second plurality of boost fans for a second interval.

15. The method of claim 14, wherein the output voltage of the fan failure compensation circuit is approximately twenty percent greater than the base voltage of the plurality of fans, wherein the boosted fan speed is approximately fifteen percent greater than the rated fan speed of the plurality of fans.

16. The method of claim 14, wherein the first plurality of boost fans is determined by selection from the functioning fans based on the location of a respective functioning fan relative to the failed first fan.

17. The method of claim 14, wherein the first plurality of boost fans are selected based on whether the failure of the first fan is a complete failure or a partial failure.

18. The method of claim 14, wherein the first plurality of boost fans are selected based on whether the failed first fan is a double-rotor fan.

\* \* \* \* \*